(12) United States Patent
Hosokai et al.

(10) Patent No.: US 11,425,834 B2
(45) Date of Patent: Aug. 23, 2022

(54) INFORMATION DEVICE AND COVER

(71) Applicant: Lenovo (Singapore) Pte. Ltd., Singapore (SG)

(72) Inventors: Tatsuya Hosokai, Kanagawa (JP); Tatsuya Ushioda, Kanagawa (JP); Hiroaki Kinoshita, Kanagawa (JP); Tetsuya Sano, Kanagawa (JP); Kazuya Tatsuno, Kanagawa (JP); Yuta Tsuganezawa, Kanagawa (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 17/232,454

(22) Filed: Apr. 16, 2021

(65) Prior Publication Data

US 2022/0225522 A1 Jul. 14, 2022

(30) Foreign Application Priority Data

Jan. 14, 2021 (JP) .............................. JP2021-004054

(51) Int. Cl.
*H05K 5/03* (2006.01)
*G06F 1/16* (2006.01)
*H05K 5/02* (2006.01)

(52) U.S. Cl.
CPC ............. *H05K 5/03* (2013.01); *G06F 1/1616* (2013.01); *H05K 5/0213* (2013.01); *G06F 2200/1633* (2013.01)

(58) Field of Classification Search
CPC ...... H05K 5/03; H05K 5/0213; H05K 5/0243; G06F 1/1616; G06F 1/1626; G06F 2200/1633; H04M 1/0283
See application file for complete search history.

(56) References Cited

U.S. PATENT DOCUMENTS

| 8,273,986 | B2 * | 9/2012 | Liu ........................... B44C 3/10 455/575.8 |
| 8,675,358 | B2 * | 3/2014 | Shin ..................... H04M 1/0283 361/679.55 |
| 9,753,490 | B2 * | 9/2017 | Hill ........................ G06F 1/1613 |
| 10,317,618 | B2 * | 6/2019 | Seo ........................ G06F 1/1656 |

(Continued)

FOREIGN PATENT DOCUMENTS

JP 2018105961 A 7/2018

*Primary Examiner* — Abhishek M Rathod
(74) *Attorney, Agent, or Firm* — Osha Bergman Watanabe & Burton LLP

(57) ABSTRACT

An information device and a cover that are suitable for forming design marks on a soft material and enhance the appearance quality. The cover includes: a core as a base; an auxiliary sheet closer to a surface than the core; a surface material closer to the surface than the auxiliary sheet, the surface material being softer than the core; and a design mark part including a baseplate and a design mark protruding from the baseplate. The baseplate is disposed in a plate recessed portion having a shape corresponding to a contour of the baseplate and disposed in a surface of the core. The design mark is exposed to the surface through design mark holes in the auxiliary sheet and the surface material, the design mark holes having a contour shape of the design mark. The auxiliary sheet covers at least the contour of the baseplate and the plate recessed portion.

5 Claims, 10 Drawing Sheets

(56) References Cited

U.S. PATENT DOCUMENTS

| | | | |
|---|---|---|---|
| 2007/0085269 A1* | 4/2007 | Martin, Jr. | A63F 9/10 273/157 R |
| 2011/0048754 A1* | 3/2011 | Xiong | C23C 28/00 174/50 |
| 2011/0078932 A1* | 4/2011 | Wilcoxen | G09F 1/12 40/124.191 |
| 2019/0196544 A1* | 6/2019 | Mizoguchi | G06F 1/1652 |

* cited by examiner

INFORMATION DEVICE AND COVER

FIELD OF THE INVENTION

The present invention relates to an information device and a cover that defines the chassis of the information device or covers the chassis.

BACKGROUND OF THE INVENTION

Information devices such as laptop PCs and tablet PCs require the protection from a damage and a breakage during carriage. Information devices also require a high quality external design and tactile feel. For the protection and decoration, some information devices come with a cover on the rear face of the chassis.

In Japanese Unexamined Patent Application Publication No. 2018-105961, the present applicant proposed a cover for a foldable table PC.

Leather can be used as the skin material of the cover, and this leads to sophisticated appearance quality and favorable tactile feel. As illustrated in FIG. 9, the cover 500 in this case is produced by attaching leather 504 to the surface of a core 502. On leather, a design mark can be formed by engraving.

For a clearer marking on the leather than by engraving, another possible method includes forming a design mark hole 506 in the leather 504 to let a design mark 508 project from the design mark hole 506. The design mark 508 may be configured to protrude from a baseplate 510, which prevents the design mark 508 from coming off the design mark hole 506. To prevent the contour of the baseplate 510 from appearing to the surface of the leather 504, the baseplate 510 may be fitted into a plate recessed portion 512 of the core 502.

Such a baseplate 510 fitted into the plate recessed portion 512, however, may fail to prevent the contour of the baseplate 510 from appearing to the surface of the leather 504, causing deterioration of the appearance quality. This is because the leather 504 is a soft material, and so a slight height difference or a gap between the baseplate 510 and the surface 502a of the core 502 may appear to the surface of the leather 504.

SUMMARY OF THE INVENTION

One or more embodiments of the present invention provide an information device and a cover that are suitable for forming a design mark on a soft material and having improved appearance quality.

The first aspect of the present invention relates to an information device including a cover that defines a chassis or covers the chassis. The cover includes: a core as a base; an auxiliary sheet closer to a surface of the cover than the core; a surface material closer to the surface than the auxiliary sheet, the surface material being softer than the core; and a design mark part including a baseplate and a design mark protruding from the baseplate. The baseplate is disposed in a plate recessed portion, the plate recessed portion having a shape corresponding to a contour of the baseplate and disposed in a surface of the core. The design mark is exposed to the surface through design mark holes in the auxiliary sheet and the surface material, the design mark holes having a contour shape of the design mark. The auxiliary sheet covers at least the contour of the baseplate and the plate recessed portion.

A cover according to the second aspect of the present invention defines a chassis of an information device or covers the chassis, and the cover includes: a core as a base; an auxiliary sheet closer to a surface of the cover than the core; a surface material closer to the surface than the auxiliary sheet, the surface material being softer than the core; and a design mark part including a baseplate and a design mark protruding from the baseplate. The baseplate is disposed in a plate recessed portion, the plate recessed portion having a shape corresponding to a contour of the baseplate and disposed in a surface of the core. The design mark is exposed to the surface through design mark holes in the auxiliary sheet and the surface material, the design mark holes having a contour shape of the design mark. The surface material and the auxiliary sheet cover at least the contour of the baseplate and the plate recessed portion.

The baseplate fitted into the plate recessed portion may have a slight difference in height or a gap from the core. Even in this case, the moderately hard auxiliary sheet intervening between the surface material and the core prevents these height difference and gap from appearing to the surface of the surface material. The information device and the cover according to the above-described aspects are suitable for forming design marks on a surface material, which may be a soft material, and enhance the appearance quality.

The cover may include a heat dissipation sheet between the auxiliary sheet and the core. The heat dissipation sheet may have a design mark hole, and the design mark may penetrate through the design mark hole of the heat dissipation sheet. The auxiliary sheet has another function of preventing the uneven shape caused by the heat dissipation sheet from being transferred to the surface material.

The surface material may include leather to enhance the external design and tactic feel.

The core may have a recessed portion for component placement on the rear face, and the plate recessed portion may have a through hole at a part where the plate recessed portion and the recessed portion for component placement overlap in plan view. Such a through hole eliminates a part of the bottom of the plate recessed portion that is excessively thin and unstable in shape, and so prevents burrs and the like due to dimensional errors during manufacturing.

The information device and the cover according to the above-described aspects are suitable for forming design marks on a surface material, which may be a soft material, and enhance the appearance quality.

DETAILED DESCRIPTION OF THE INVENTION

The following describes embodiments of the information device and the cover according to the present invention in details, with reference to the drawings. The present invention is not limited to the following embodiments.

Figure 1:
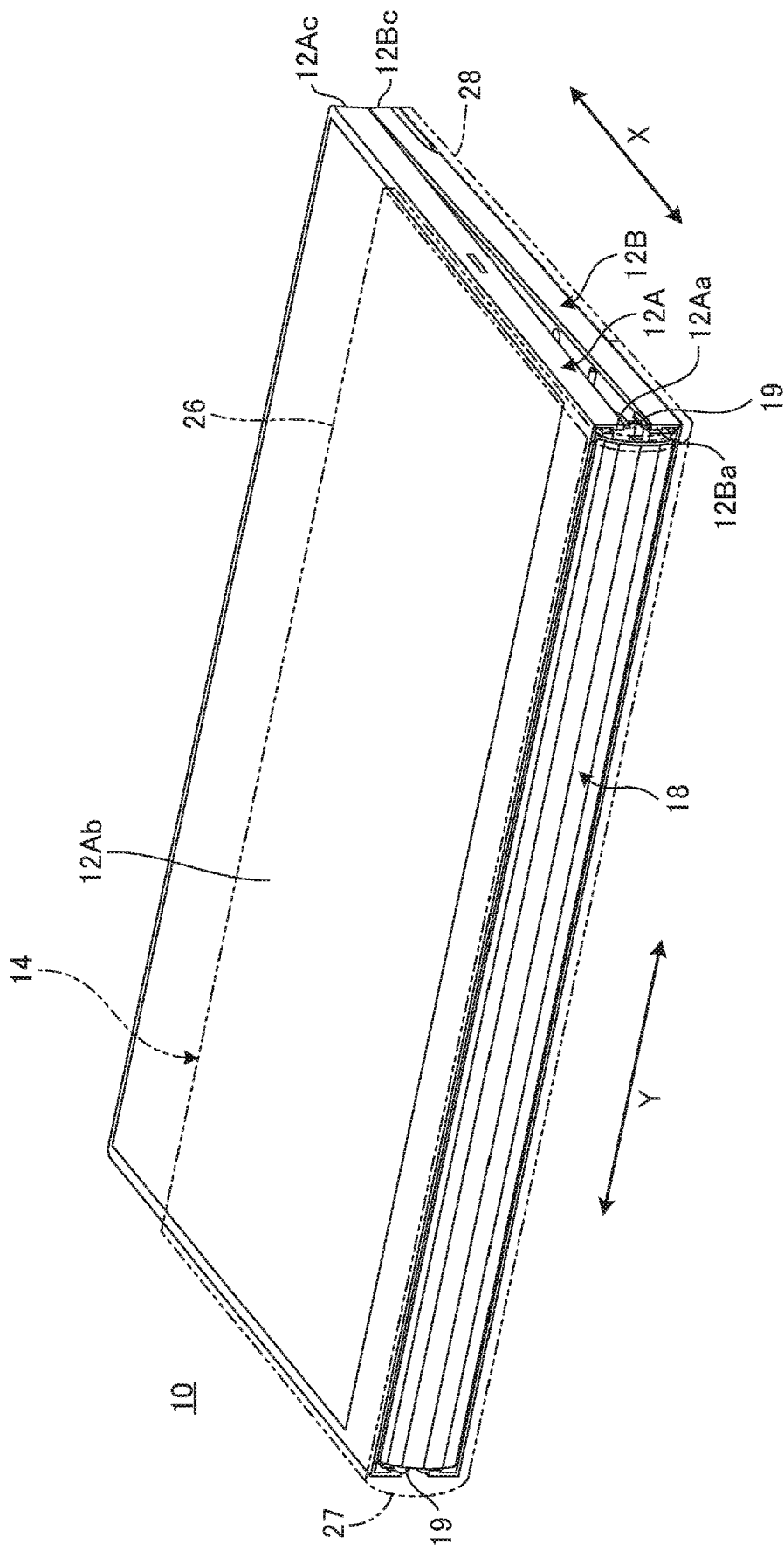
FIG. 1 is a perspective view of an information device according to one or more embodiments when the information device is closed to have a folded form.

FIG. 1 is a perspective view of an information device 10 according to one embodiment when the information device is closed to have a folded form. Firstly the overall structure of the information device 10 is described below.

Referring to the attached drawings, the following describes an information device and a cover according to the present invention in details, by way of preferable embodiments.

Figure 2A:
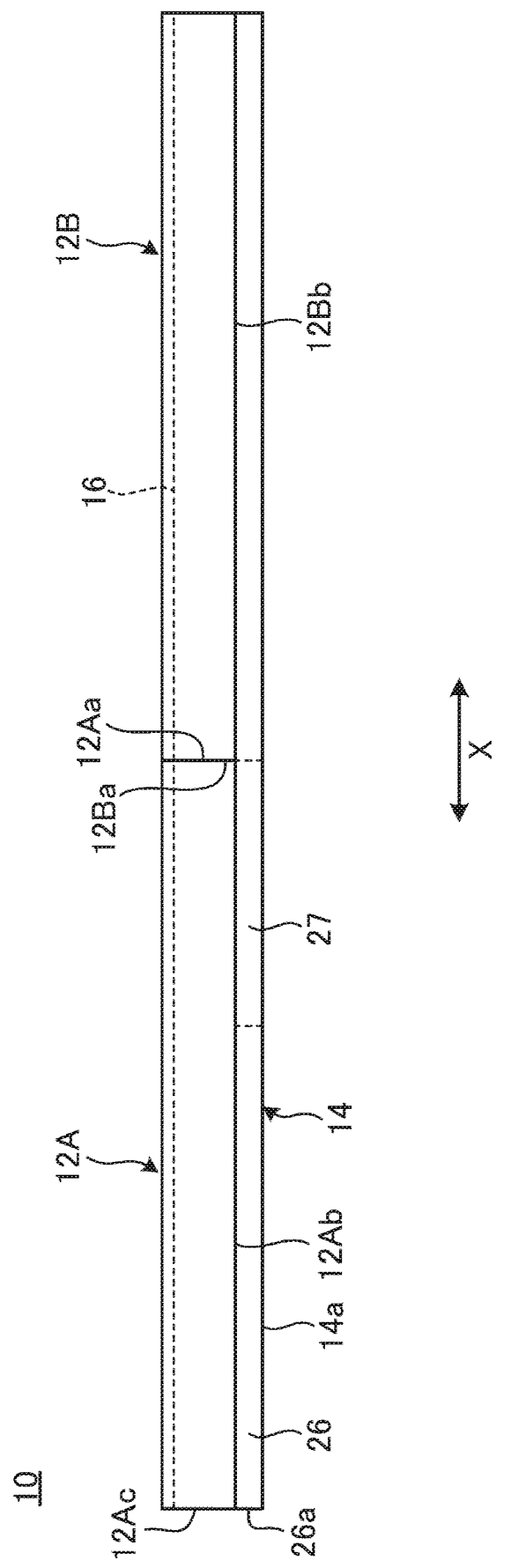
FIG. 2A is a side view schematically illustrating the information device when the information device is opened to have a flat plate form.
Figure 2B:
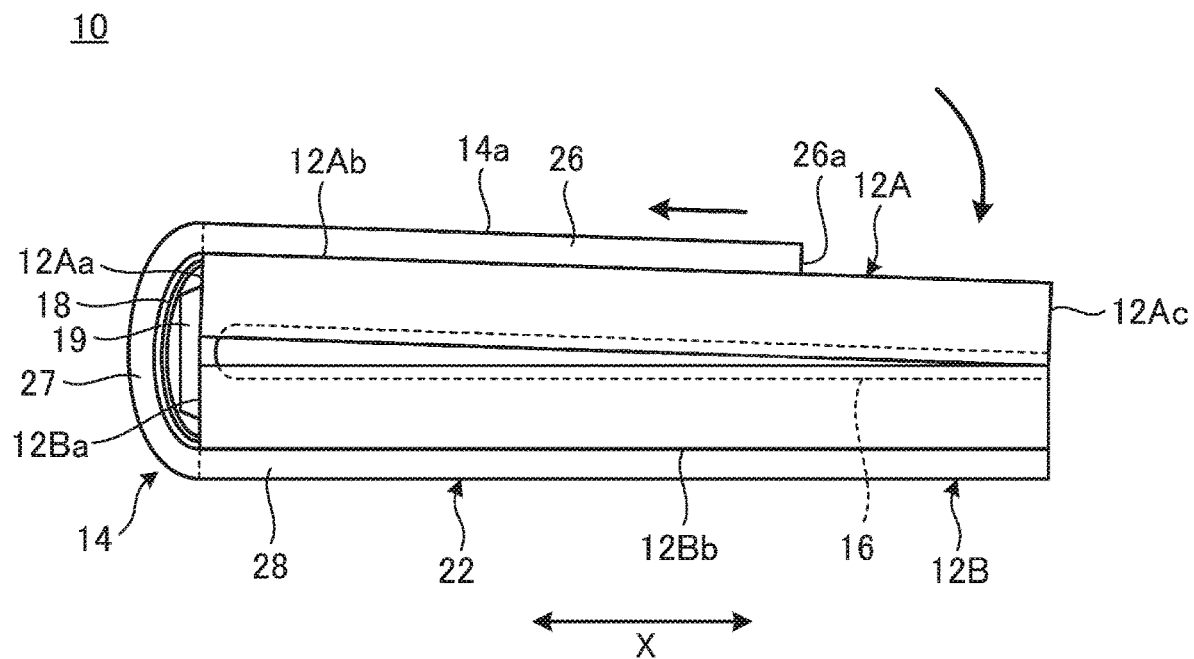
FIG. 2B is a side view of the information device when the information device is closed to be in the folded form.

FIG. 1 is a perspective view of an information device 10 according to one embodiment when the information device is closed to have a folded form. FIG. 2A is a side view schematically illustrating the information device 10 of FIG. 1 when the information device is opened to be in the flat plate form. FIG. 2B is a side view of the information device 10 when the information device is closed to be in the folded form.

As illustrated in FIGS. 1 to 2B, the information device 10 includes a first chassis 12A, a second chassis 12B, and a cover 14. The information device 10 of the present embodiment is a foldable tablet PC or laptop PC. The cover 14 has a protective function of covering the outer faces of the chassis 12A and 12B to protect them, and a decorative function of decorating the outer faces to enhance the appearance design. Instead of this information device 10, the information device to which the cover 14 is attached may be various devices, including a typical clamshell laptop PC, a tablet PC of a single plate, a smartphone, and a game machine.

First, the configuration of the information device 10 will be described. The information device 10 includes the chassis 12A and 12B and a display 16.

The chassis 12A and 12B are placed adjacent to each other. Adjacent ends 12Aa and 12Ba of the chassis 12A and 12B are internally covered with a backbone member 18. Each chassis 12A, 12B is a rectangular plate member having side walls standing on the three sides other than at the adjacent end 12Aa, 12Ba. In one example, the chassis 12A and 12B are plates made of metal such as stainless steel, magnesium, or aluminum, or are fiber reinforced resin plates containing reinforcing fibers such as carbon fiber.

As illustrated in FIGS. 1 and 2, the following refers to the direction of placing the chassis 12A and 12B side by side as X direction, and the direction orthogonal to the X direction and along the adjacent ends 12Aa and 12Ba as Y direction to describe the information device 10.

The mutually adjacent ends 12Aa and 12Ba of the chassis 12A and 12B are connected via a pair of hinges 19 and 19. The chassis 12A and 12B are connected via the hinges 19 to be relatively rotatable between the flat plate form illustrated in FIG. 2A and the folded form illustrated in FIG. 2B. In the flat plate form, the chassis 12A and 12B are placed side by side in the direction (X direction) perpendicular to the surface normal direction to define a single plate. In the folded form, the chassis 12A and 12B are folded on top of each other. The hinges 19 can generate a predetermined rotational torque. The chassis 12A and 12B therefore are still stable in the laptop form having the angle between them of about 90 to 140 degrees. The hinges 19 are placed at both ends in the Y direction of the adjacent ends 12Aa and 12Ba of the chassis 12A and 12B, respectively, and are located outside the outer peripheral edge of the display 16. The information device 10 of the present embodiment is configured so that the center of rotation between the chassis 12A and 12B via the hinges 19 coincides with the surface of the display 16.

The chassis 12A and 12B accommodate a motherboard and a various semiconductor chips such as a CPU mounted on the motherboard, and various electronic components such as a communication module, a battery device, and a cooler.

In one example, the display 16 is a liquid crystal display of a touch-screen type. The display 16 has a bending region in a band-shaped range straddling the adjacent ends 12Aa and 12Ba and extending in the Y direction. With this configuration, the display 16 can be folded together with the chassis 12A and 12B when the chassis are folded, and is opened and closed with the opening/closing motion of the chassis 12A and 12B. In one example, the display 16 is a flexible display such as an organic electro luminescence (EL) having a highly flexible paper structure.

Figure 3:
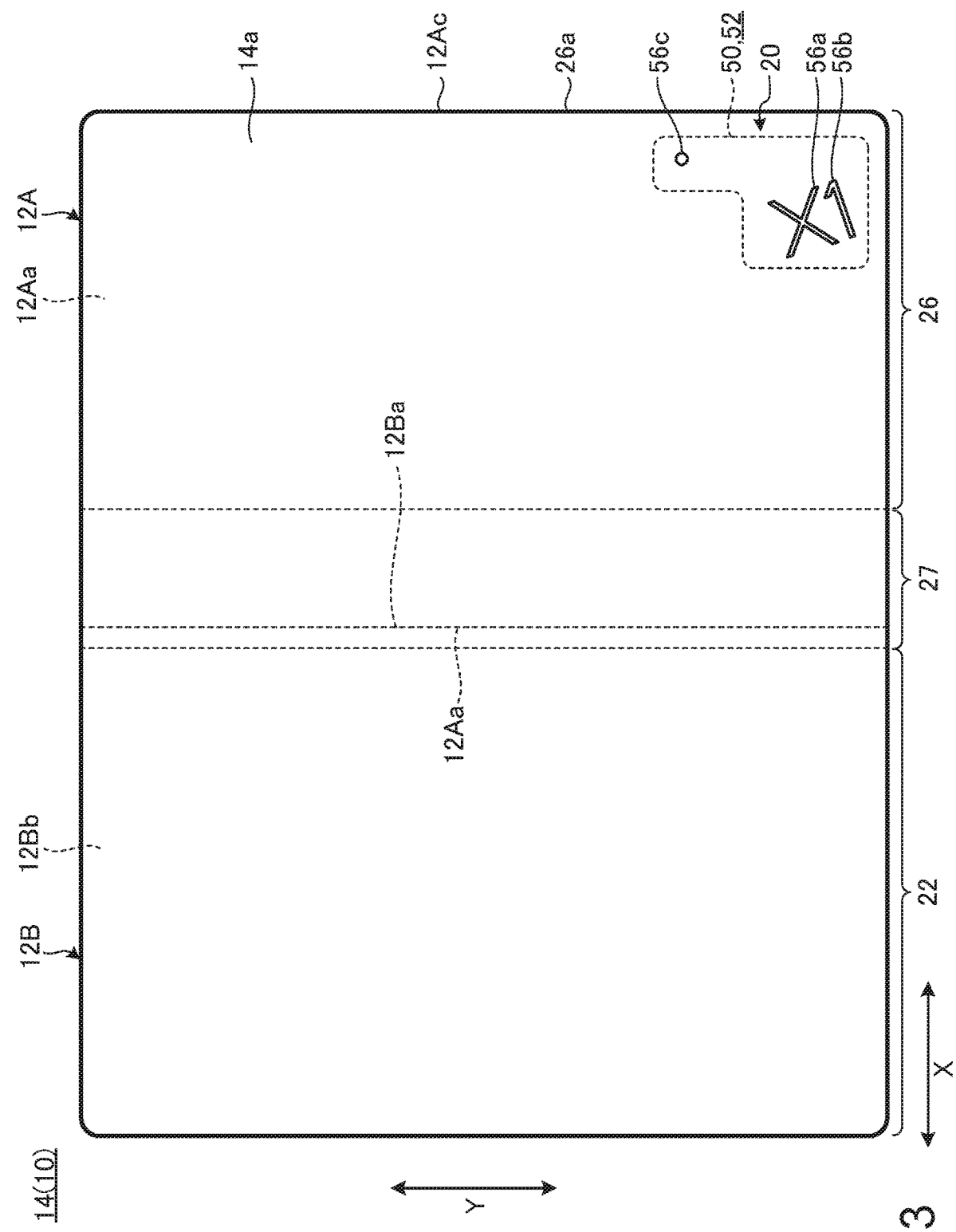
FIG. 3 is a plan view of the information device viewed from the face having the cover thereon.

Next the following describes the overall configuration of the cover 14. FIG. 3 is a plan view of the information device 10 viewed from the face having the cover 14 thereon.

As illustrated in FIGS. 1 to 3, the cover 14 covers the rear faces 12Ab and 12Bb of the chassis 12A and 12B. In the usage form (see FIG. 2A), the cover 14 covers the entire rear faces 12Ab and 12Bb. In the laptop form or folded form (see FIG. 2B), the cover 14 covers most of the rear face 12Ab and the entire rear face 12Bb.

The cover 14 is made up of a slide cover portion 26, a bent cover portion 27, and a fixed cover portion 28 in this order from the first chassis 12A to the second chassis 12B.

The slide cover portion 26 is a thin plate that is movable relative to the rear face 12Ab of the first chassis 12A in the X direction. In the flat plate form illustrated in FIGS. 2A and 3, the slide cover portion 26 has a distal end 26a that coincides with the open end 12Ac of the first chassis 12A. In the laptop form and the folded form, the distal end 26a of the slide cover portion 26 slides to a position receding from the open end 12Ac toward the adjacent end 12Aa.

The bent cover portion 27 is placed at a position straddling the adjacent ends 12Aa and 12Ba between the chassis 12A and 12B, and is a band-shaped region that is narrow in the X direction and extends in the Y direction. The bent cover portion 27 has flexibility as a whole, and connects the slide cover portion 26 and the fixed cover portion 28 so as to be relatively rotatable. The bent cover portion 27 serves as a flexible hinge for rotating the cover 14 while following the rotating motion between the chassis 12A and 12B. The bent cover portion 27 is a bent region having a width in the X direction that can cover at least between the adjacent ends 12Aa and 12Ba of the chassis 12A and 12B in the folded form illustrated in FIG. 2B.

The fixed cover portion 28 is a thin plate that covers the rear face 12Bb of the second chassis 12B together with a part of the bent cover portion 27. The fixed cover portion 28 is fixed to the rear face 12Bb of the second chassis 12B.

As illustrated in FIG. 3, the cover 14 has a design-mark display portion 20 at the end of the slide cover portion 26, where three design marks 56a, 56b, and 56c are placed. The design-mark display portion 20 may be in the fixed cover portion 28. The design-mark display portion 20 is described later. FIG. 3 omits the detailed structure of the design-mark display portion 20.

Figure 4:
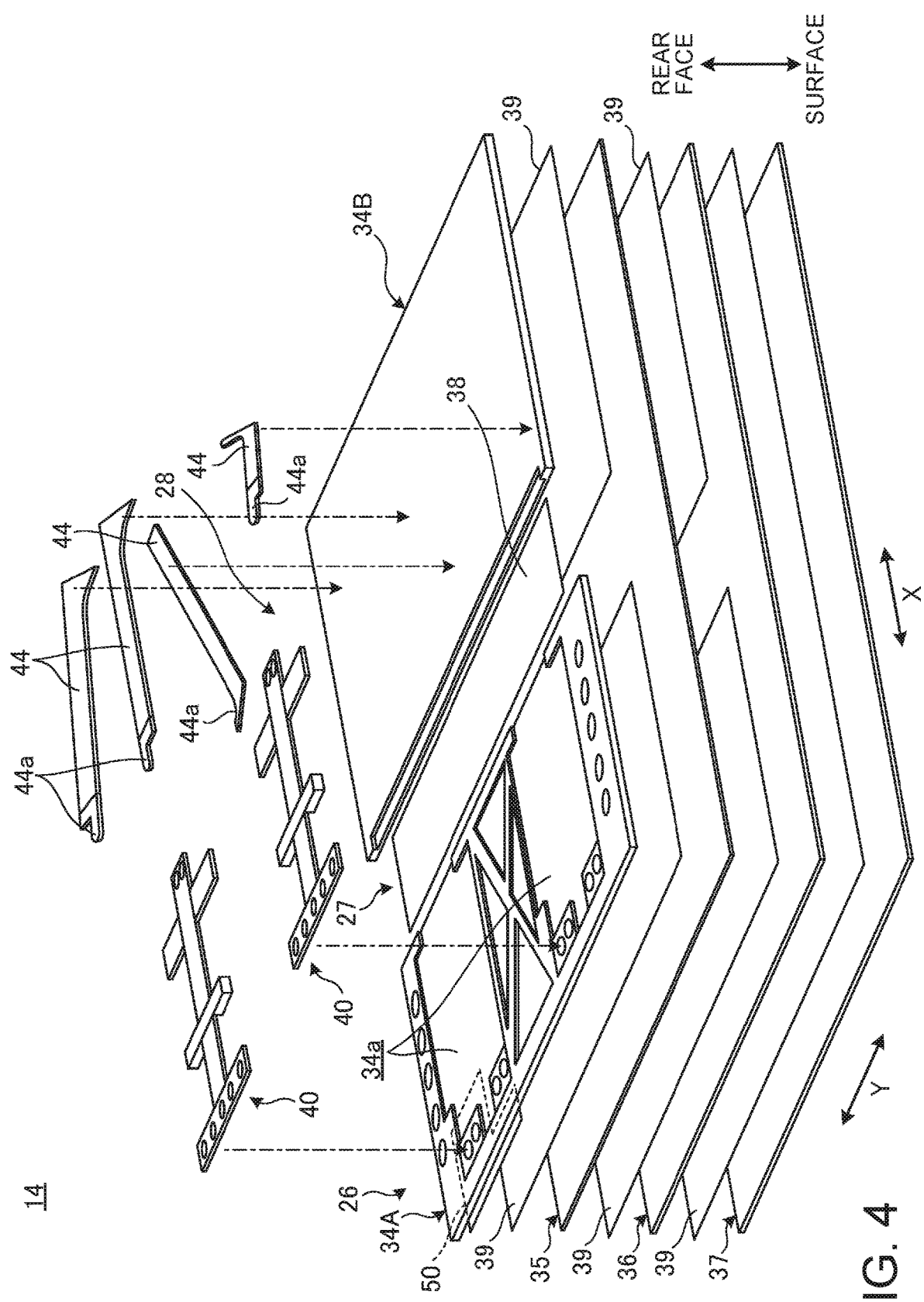
FIG. 4 is a schematic exploded perspective view of the cover according to one or more embodiments.

Next the following describes a specific structure of the cover 14. FIG. 4 is a schematic exploded perspective view of the cover 14. The cover 14 has a surface directed to the bottom of FIG. 4, i.e., in the direction from a core 34A to a surface material 37, and has a rear face directed to the top of FIG. 4, i.e., in the direction from the surface material 37 to the core 34A.

As illustrated in FIG. 4, the slide cover portion 26 of the cover 14 has the structure having the core 34A, a graphite sheet (heat dissipation sheet) 35, an auxiliary sheet 36, and the surface material 37 laminated in this order from the rear face 12Ab of the first chassis 12A. The slide cover portion 26 includes a design mark part 50 at a position corresponding to the design-mark display portion 20. The design mark part 50 is described later.

The fixed cover portion 28 has the structure having a core 34B, the graphite sheet 35, the auxiliary sheet 36, and the surface material 37 that are laminated in this order from the rear face 12Bb of the second chassis 12B. The bent cover portion 27 has the structure having a protective cover 38, the graphite sheet 35, the auxiliary sheet 36, and the surface material 37 that are laminated in this order from the rear faces 12Ab, 12Bb of the chassis 12A and 12B. Reference numeral 39 in FIG. 4 denotes a fixing member such as a double-sided tape, adhesive, or glue.

The core 34A is a hard member that is the base of the cover 14. The core 34A extends over substantially the entire face of the slide cover portion 26, and has recessed portions and cutouts in various places for placing components and reducing weight. The core 34A is a plate-like member that is molded and is made of a resin such as glass fiber reinforced plastic (GFRP) including glass fibers impregnated with epoxy resin, or polycarbonate (PC). The core 34A has a thickness of about 1 to 2 mm, for example.

The core 34B is a hard member that is the base of the fixed cover portion 28. The core 34B may be made of the same material and have the same thickness as the core 34A of the slide cover portion 26, except that their shapes are different.

The slide cover portion 26 is connected via a pair of slide mechanisms 40 spaced apart in the Y direction to be movable relative to the first chassis 12A in the X direction. Each slide mechanism 40 is placed in a corresponding large recessed portion (recessed portion for component placement) 34A formed on the rear face of the core 34A.

In the fixed cover portion 28, the core 34B is fixed to the rear face 12Bb of the second chassis 12B with a plurality of pieces (four pieces in FIG. 4) of double-sided adhesive tape 44. Each piece of the double-sided adhesive tape 44 has tensile peelable properties. The double sided adhesive tape 44 is a component also referred to as stretch release tape, stretch double sided tape, or stretchable tape. Each piece of the double-sided adhesive tape 44 has a tab 44a at one end for user's tension-peeling operation. Each piece of the double-sided adhesive tape 44 can be easily peeled off at both adhesive surfaces by pulling the tab 44a.

The graphite sheet 35 is fixed to the surfaces of the cores 34A and 34B with the fixing members 39 to be laminated. The graphite sheet 35 extends over a substantially entire face of the cover 14. The graphite sheet 35 has a thickness of about 0.05 to 0.15 mm, for example. The graphite sheet 35 is a heat diffusion sheet that absorbs the heat generated in the information device 10 for diffusion. The cover 14 having such a graphite sheet 35 suppresses the formation of local hot areas (hot spots) on its surface 14a. The graphite sheet 35 may be omitted depending on design conditions.

The auxiliary sheet 36 is fixed to the surface of the graphite sheet 35 with the fixing members 39 to be laminated. The auxiliary sheet 36 is placed to cover the entire face of the graphite sheet 35 to prevent the uneven shape of the graphite sheet 35 due to bubbles, wrinkles, etc. from being transferred to the surface material 37. The auxiliary sheet 36 is softer than the cores 34A and 34B and is harder than the surface material 37. The auxiliary sheet 36 is a sheet-like member that is molded and is made of a resin such as polycarbonate (PC). The auxiliary sheet 36 has a thickness of about 0.1 to 0.5 mm, for example. The auxiliary sheet 36 is not limited to a sheet-like member, and may be a plate-like member.

The surface material 37 is a skin material for enhancing the external design and tactile feel of the cover 14. The surface material 37 is fixed to the surface of the auxiliary sheet 36 with the fixing member 39 to be laminated. The surface material 37 covers the entire face of the auxiliary sheet 36 so as to define the surface 14a of the cover 14. The surface material 37 is made of artificial leather, natural leather, or resin (e.g., rubber or silicone rubber), for example, and is a sheet-like member that is softer than the auxiliary sheet 36 and the cores 34A and 34B. The surface material 37 has a thickness of about 0.5 to 1 mm, for example.

The bent cover portion 27 does not have the cores 34A and 34B, and is placed at an area overlapping with the gap between the cores 34A and 34B. The bent cover portion 27 includes only the protective cover 38, which is flexible, the graphite sheet 35, the auxiliary sheet 36, and the surface material 37. The bent cover portion 27 has no core, and so has flexibility as a flexible hinge. In other words, the bending region of the graphite sheet 35, the auxiliary sheet 36, and the surface material 37 makes up the bent cover portion 27.

In the bent cover portion 27, the protective cover 38 covering the gap between the cores 34A and 34B is attached to the rear face of the graphite sheet 35. The protective cover 38 is a sheet-like member for preventing spillage of graphite powder and the like. The protective cover 38 may be omitted. In this case, the rear face of the graphite sheet 35 may be covered with a coating of resin, for example.

Figure 5:
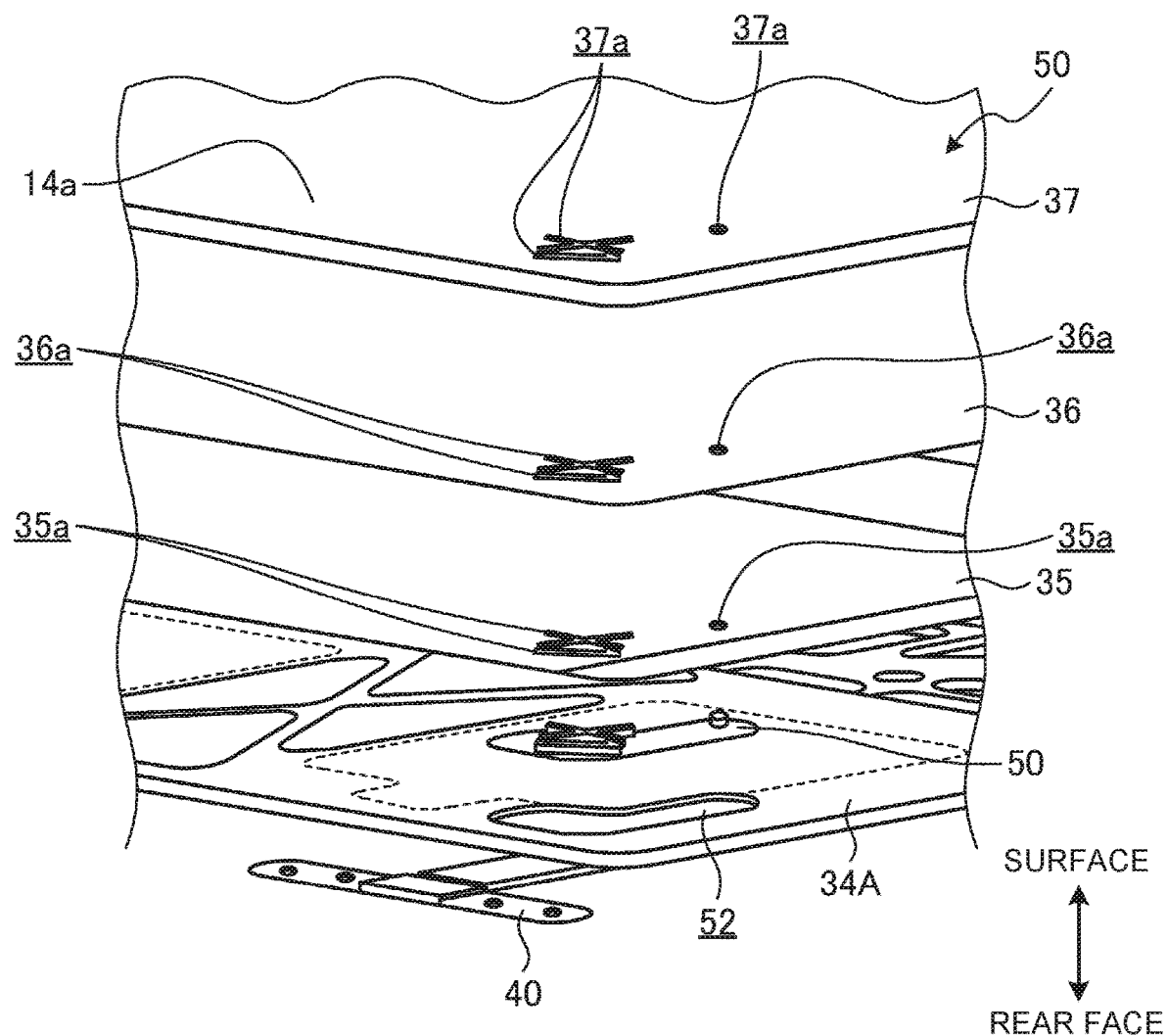
FIG. 5 is an exploded perspective view of a design-mark display portion viewed obliquely from the surface.
Figure 6:
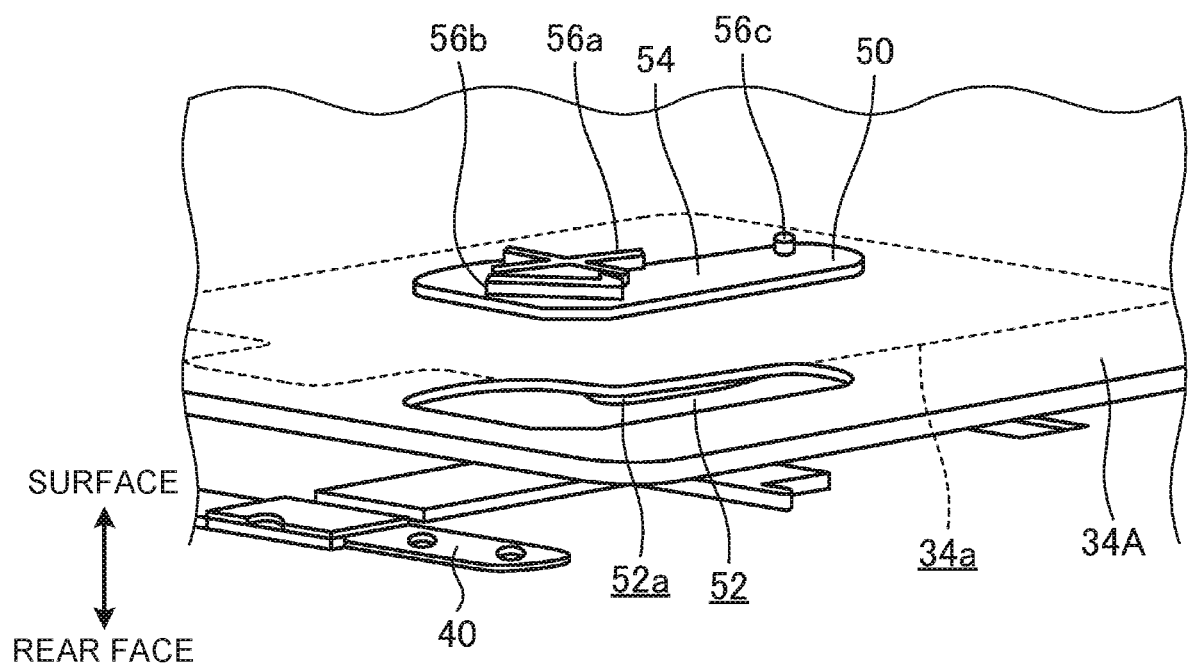
FIG. 6 is a partially enlarged and exploded perspective view of the design-mark display portion viewed obliquely from the surface.
Figure 7:
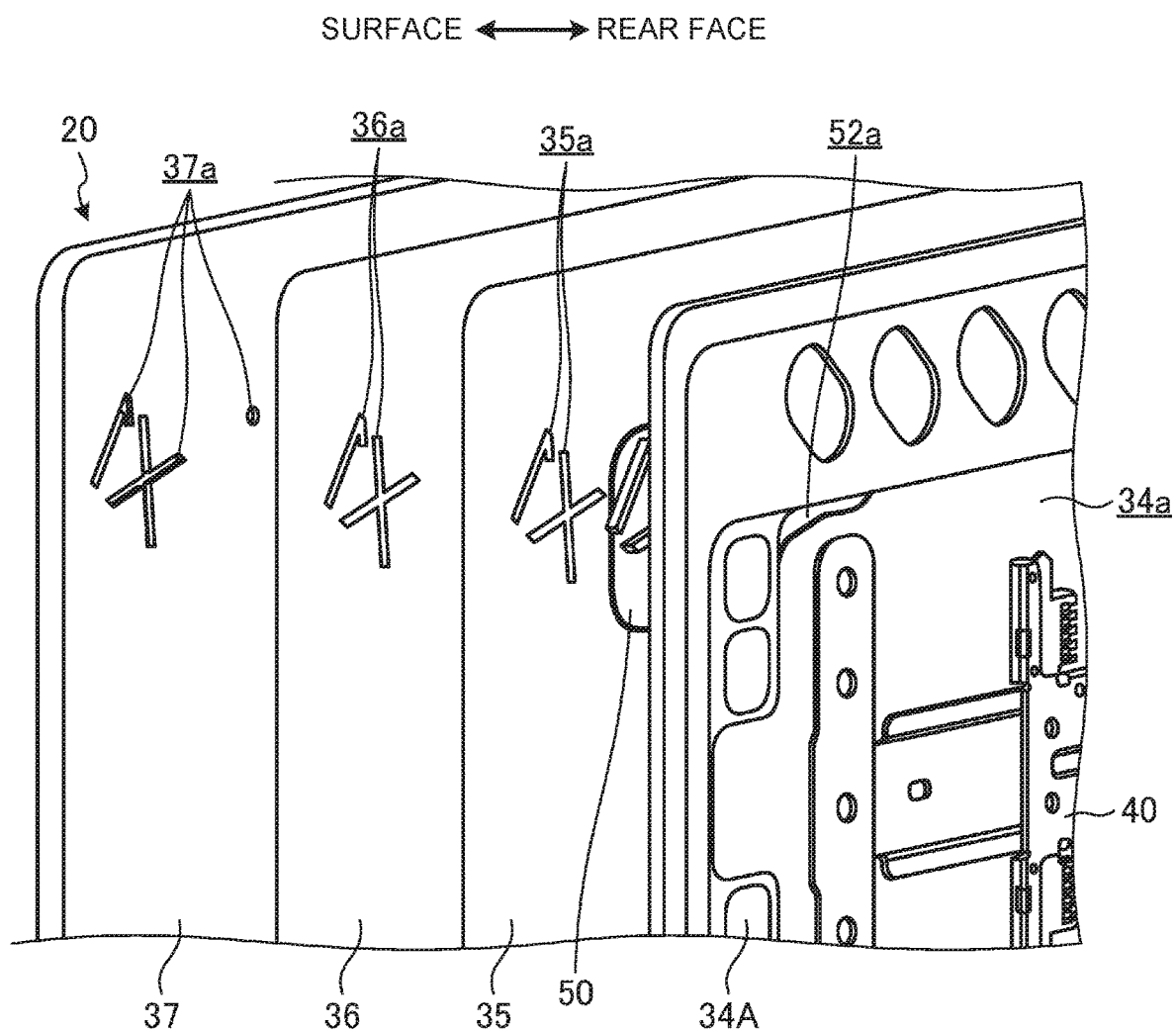
FIG. 7 is an exploded perspective view of the design-mark display portion viewed obliquely from the rear face.

Referring next to FIGS. 5 to 7, the following describes the structure of the design-mark display portion 20. FIG. 5 is an exploded perspective view of the design-mark display portion 20 viewed obliquely from the surface. FIG. 6 is a partially enlarged and exploded perspective view of the design-mark display portion 20 viewed obliquely from the surface. FIG. 7 is an exploded perspective view of the design-mark display portion 20 viewed obliquely from the rear face.

As illustrated in FIGS. 5 to 7, the design-mark display portion 20 includes the design mark part 50. The design mark part 50 includes a baseplate 54, and design marks 56a, 56b, and 56c (hereinafter they may be collectively called design marks 56) protruding from the baseplate 54. The design mark part 50 is made of a resin that is harder than the surface material 37. The baseplate 54 is a thin plate having a substantially L-letter shape that corresponds to the placement of the design marks 56. The baseplate 54 has corners each of which has an arc shape.

The design marks 56 indicate letters, numbers or marks. The design marks 56a and 56b indicate a letter and a number that are placed side by side. The design mark 56c is a small circle mark located at a slight distance from the design marks 56a and 56b. The design marks 56 may be painted in a single color or a plurality of colors different from the color of the surface material 37.

The design marks 56 enable clearer marking than by engraving, and enhance the design of the marks. The surface material 37 may include another means of notation, such as an engraving, in addition to the design marks 56. The design marks 56 and the engraving may be combined to show some pattern. For example, the small circle of the design mark 56c may indicate the dot portion of the engraved alphabet "i" or "j".

In the design-mark display portion 20, a plate recessed portion 52 is formed on the surface of the core 34A. The plate recessed portion 52 has a shape corresponding to the contour of the baseplate 54 in plan view, so that the baseplate 54 is fitted into the plate recessed portion 52. The depth of the plate recessed portion 52 is equal to or slightly deeper than the thickness of the baseplate 54. The baseplate 54 therefore does not protrude from the core 34A. The baseplate 54 is fixed to the plate recessed portion 52 with adhesive tape, for example.

The plate recessed portion 52 basically has a bottom and so the baseplate 54 does not come out the plate recessed portion 52. The plate recessed portion 52 has a through hole 52a at the part where the plate recessed portion 52 and the recessed portion 34a for component placement overlap in plan view. The through hole 52a is limited to a small area.

Such a through hole 52a eliminates a part of the bottom of the plate recessed portion 52 that is excessively thin and unstable in shape, and so prevents burrs and the like due to dimensional errors during manufacturing. This allows the baseplate 54 to be correctly placed in the plate recessed portion 52.

The graphite sheet 35, the auxiliary sheet 36 and the surface material 37 have design mark holes 35a, 36a and 37a, respectively. The design mark holes 35a, 36a, and 37a are holes having a shape corresponding to the contour shapes of the design marks 56. Specifically three holes are provided corresponding to the design marks 56a to 56c.

The design marks 56 are exposed to the surface through these design mark holes 35a, 36a, and 37a. The design marks 56 protrude slightly above the surface 14a. The design mark holes 37a in the surface material 37 are blocked by the design marks 56, so that the hole walls are not exposed and are protected. The design mark holes 37a are blocked by the design marks 56 so that no foreign matter accumulates.

Figure 8:
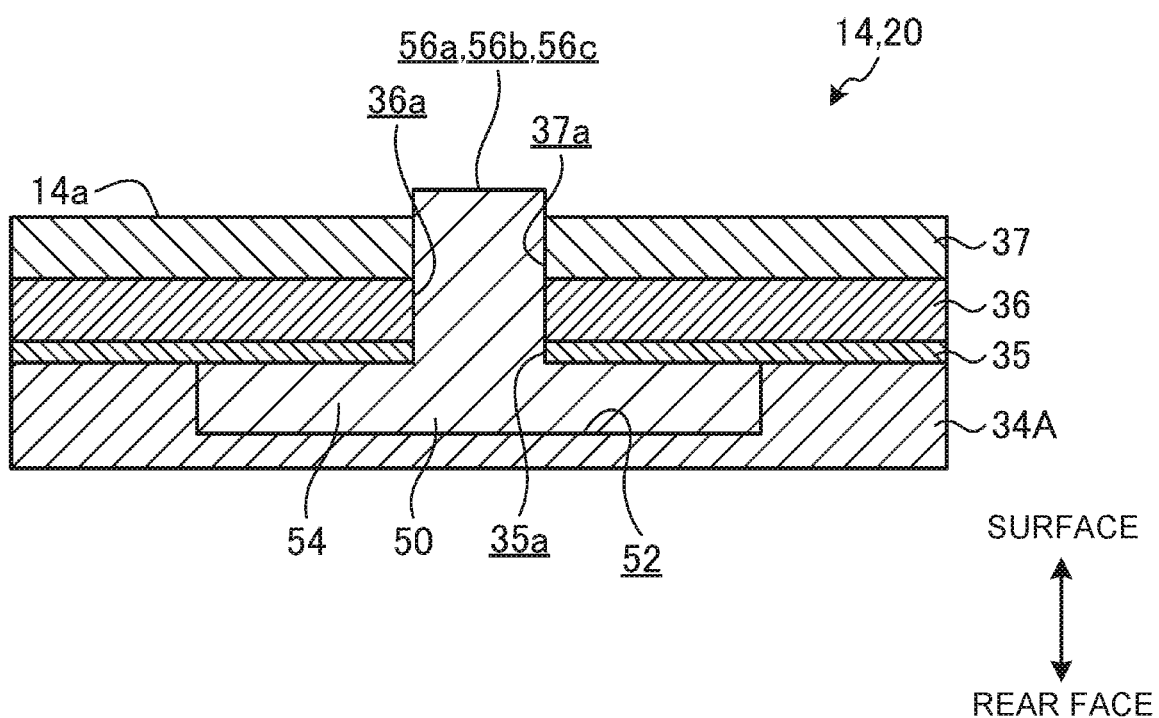
FIG. 8 is a schematic cross-sectional view of the design-mark display portion.
Figure 9:
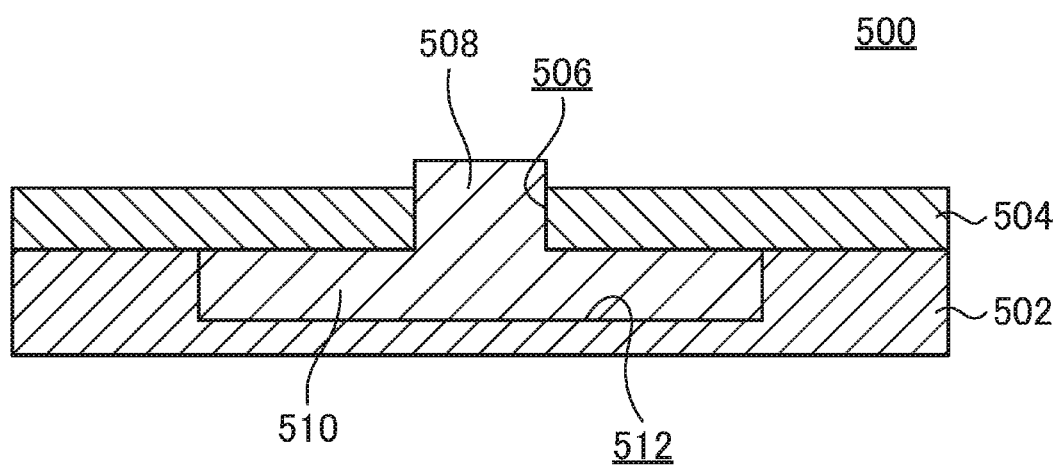
FIG. 9 is a schematic cross-sectional view of the cover according to a comparative example.

FIG. 8 is a schematic cross-sectional view of the design-mark display portion 20. FIG. 8 omits the recessed portion 34a. As described above, the baseplate 54 of the design mark part 50 is placed in the plate recessed portion 52 formed on the surface of the core 34A and having the contour shape of the baseplate 54, and the design marks 56 are exposed to the surface through the design mark holes 35a, 36a and 37a formed in the graphite sheet 35, the auxiliary sheet 36 and the surface material 37 and having the contour shape of the design marks 56.

The auxiliary sheet 36 covers the entire face of the slide cover portion 26, and so it naturally covers at least the contour of the baseplate 54 and the plate recessed portion 52 (see dashed line portion in FIG. 3).

In this embodiment, the surface material 37 is made of leather, which is a soft material, and the baseplate 54 fitted into the plate recessed portion 52 may have a slight difference in height or a gap from the core 34A. Even in this case, the moderately hard auxiliary sheet 36 intervening between the surface material 37 and the core 34A prevents these height difference and gap from appearing to the surface 14a of the surface material 37. In this way, the information device 10 and the cover 14 are suitable for forming design marks on the soft material and enhance the appearance quality. The auxiliary sheet 36 is not a dedicated part for covering the shape of the baseplate 54, but also has another function of preventing the uneven shape caused by the graphite sheet 35 from being transferred to the surface material 37 as described above. This can reduce the number of the parts.

The cover 14 in the above example covers the chassis 12A, 12B, and the cover 14 itself may form a part or all of the chassis.

The cover 14 includes the graphite sheet 35 on the surface of the core 34A, the auxiliary sheet 36 on the surface of this graphite sheet 35, and the surface material 37 on the surface of this auxiliary sheet 36. The surface material 37 is on the most surface side in the cover 14, and the cover 14 may further include a transparent sheet, for example, on the surface thereof in some specifications.

The present invention is not limited to the above-described embodiments, and can be modified freely without deviating from the scope of the present invention. Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

DESCRIPTION OF SYMBOLS

10 Information device
12A, 12B Chassis
14 Cover
14a Surface
20 Design-mark display portion
26 Slide cover portion
34a Recessed portion (recessed portion for component placement)
34A, 34B Core
35 Graphite sheet (heat dissipation sheet)
35a, 36a, 37a Design mark hole
36 Auxiliary sheet
37 Surface material
40 Slide mechanism
50 Design mark part
52 Plate recessed portion
52a Through hole
54 Baseplate
56, 56a, 56b, 56c Design mark

The invention claimed is:

1. An information device comprising a cover that defines a chassis or covers the chassis,
the cover having a surface and comprising:
a core as a base;
an auxiliary sheet closer to the surface than the core;
a surface material closer to the surface than the auxiliary sheet, the surface material being softer than the core; and
a design mark part including a baseplate and a design mark protruding from the baseplate, wherein
the baseplate is disposed in a plate recessed portion, the plate recessed portion having a shape corresponding to a contour of the baseplate and disposed in a surface of the core, the design mark is exposed to the surface through design mark holes in the auxiliary sheet and the surface material, the design mark holes having a contour shape of the design mark, and the auxiliary sheet covers at least the contour of the baseplate and the plate recessed portion.

2. The information device according to claim 1, wherein the cover further comprises a heat dissipation sheet between the auxiliary sheet and the core, wherein the heat dissipation sheet has a design mark hole, and the design mark penetrates through the design mark hole of the heat dissipation sheet.

3. The information device according to claim 1, wherein the surface material includes leather.

4. The information device according to claim 1, wherein the core has a recessed portion for component placement on the rear face, and the plate recessed portion has a through hole at a part where the plate recessed portion and the recessed portion for component placement overlap in plan view.

5. A cover that has a surface and defines a chassis of an information device or covers the chassis, comprising:

a core as a base;

an auxiliary sheet closer to the surface than the core;

a surface material closer to the surface than the auxiliary sheet, the surface material being softer than the core; and a design mark part including a baseplate and a design mark protruding from the baseplate, wherein the baseplate is disposed in a plate recessed portion, the plate recessed portion having a shape corresponding to a contour of the baseplate and disposed in a surface of the core, the design mark is exposed to the surface through design mark holes in the auxiliary sheet and the surface material, the design mark holes having a contour shape of the design mark, and the surface material and the auxiliary sheet cover at least the contour of the baseplate and the plate recessed portion.

* * * * *